United States Patent
Hughes

(10) Patent No.: US 7,564,274 B2
(45) Date of Patent: Jul. 21, 2009

(54) DETECTING EXCESS CURRENT LEAKAGE OF A CMOS DEVICE

(75) Inventor: Peter William Hughes, Henleaze (GB)

(73) Assignee: Icera, Inc. (GB)

( * ) Notice: Subject to any disclaimer, the term of this patent is extended or adjusted under 35 U.S.C. 154(b) by 0 days.

(21) Appl. No.: 11/065,904

(22) Filed: Feb. 24, 2005

(65) Prior Publication Data
US 2006/0186946 A1 Aug. 24, 2006

(51) Int. Cl.
*H03K 3/00* (2006.01)
(52) U.S. Cl. .................. 327/108; 327/544
(58) Field of Classification Search ............ 327/108, 327/544
See application file for complete search history.

(56) References Cited

U.S. PATENT DOCUMENTS

| | | | | |
|---|---|---|---|---|
| 4,682,306 A | * | 7/1987 | Sakurai et al. | 365/222 |
| 5,652,729 A | * | 7/1997 | Iwata et al. | 365/222 |
| 5,798,662 A | | 8/1998 | Marosek et al. | |
| 6,043,689 A | * | 3/2000 | Sheets et al. | 327/108 |
| 6,124,752 A | * | 9/2000 | Kuroda | 327/534 |
| 6,483,764 B2 | * | 11/2002 | Chen Hsu et al. | 365/222 |
| 6,693,448 B1 | | 2/2004 | Okada et al. | |
| 6,898,140 B2 | * | 5/2005 | Leung et al. | 365/222 |
| 6,992,942 B2 | * | 1/2006 | Ito | 365/222 |
| 6,998,901 B2 | * | 2/2006 | Lee | 365/222 |
| 7,035,131 B2 | * | 4/2006 | Huang et al. | 365/149 |
| 7,221,211 B2 | * | 5/2007 | Sumita et al. | 327/534 |
| 7,235,997 B2 | * | 6/2007 | Huang | 324/769 |
| 7,250,807 B1 | * | 7/2007 | Doyle | 327/534 |
| 7,272,065 B2 | * | 9/2007 | Lovett | 365/222 |
| 2004/0150419 A1 | | 8/2004 | Okada et al. | |

OTHER PUBLICATIONS

Modern Dictionary of Electronics, 6th Edition, Rudolf F. Graf, Howard W. Sams & Co, Indiana, 1984, pp. 771 and 992.*

* cited by examiner

*Primary Examiner*—Kenneth B. Wells
(74) *Attorney, Agent, or Firm*—McDermott Will & Emery LLP

(57) ABSTRACT

A system (10,90), apparatus (12,30,40,50,60,70) and method (100) is disclosed for detecting excess current leakage between drain/source of a metal oxide semiconductor (MOS) transistor (36,46) within a complementary MOS (CMOS) environment. A load control (32,42) is arranged as a compliment to the MOS transistor. A comparator (34,44) is electrically connected to the load control and the MOS transistor, and produces an output signal representative of the detection of a current leakage exceeding a threshold. In response to the received output signal indicating an excess current leakage, system voltage/frequency may be adjusted to prevent damage to the CMOS environment.

30 Claims, 4 Drawing Sheets

DETECTING EXCESS CURRENT LEAKAGE OF A CMOS DEVICE

FIELD OF THE INVENTION

This invention relates to complementary metal oxide semiconductor (CMOS) integrated circuit (IC) devices, and more particularly to an apparatus and method for detecting and controlling excess drain-source current leakage of transistors within a CMOS device.

BACKGROUND

The most recent generation of high performance processes contain tightly packed transistors in a CMOS environment. The performance of the transistors in such an environment is compromised by drain-source current leakage. This may permanently damage the transistor and the entire CMOS environment, for example by thermal damage if the current leakage is allowed to heat the chip beyond its normal operating temperature range.

Current leakage is due to short-channel effects, and low device threshold voltages, for example 0.3 V, compatible with low-voltage operation. As a result of the requirement of having high packing density design of the transistors, the polysilicon gate oxide of the transistor is ultra thin or relatively narrow, for example 10 Å to 20 Å, compared with gate thickness of earlier conventional transistors, for example 35 Å to 100 Å. The gate may break down creating a leakage path between channel and gate, or drain to source. In extreme cases, due to the fact that leakage current increases rapidly with temperature, the IC or chip may be permanently damaged. The cumulative leakage current from multiple transistors may become large enough exceed the device package temperature limits and damage the IC.

As semiconductor integrated circuits continue to decrease in scale and packing density of transistors is on the rise, the problems associated with drain-source current leakage is having greater impact on CMOS IC performance.

There is a need for an apparatus and method for detecting and controlling excess current leakage of a CMOS device.

SUMMARY OF THE INVENTION

An aspect of the invention provides an apparatus for detecting current leakage from a MOS transistor within a CMOS environment, the apparatus comprises a current leakage detector for detecting current leakage from the transistor, the current leakage detector electrically connected to the transistor; and a controller electrically connected to the current leakage detector forming a feedback loop to adjust frequency or supply voltage of the CMOS environment to prevent damage to the CMOS environment.

In embodiments, the current leakage detector comprises a load control electrically connected to the MOS transistor for detecting a current between a drain and a source of the MOS transistor; and a comparator electrically connected to the MOS transistor and the load control, the comparator for providing an output signal in response to a current exceeding a predetermined value detected between the drain and the source of the MOS transistor.

In an embodiment the load control may be a variable resistor. In another embodiment the load control is a detecting transistor arranged in a compliment manner with the MOS transistor, and having a gate less susceptible to current leakage than the MOS transistor. The MOS transistor may be a NFET, and the detecting transistor is a PFET in an embodiment. The MOS transistor may be a PFET, and the detecting transistor is a NFET in an embodiment.

In another embodiment the load control may further comprise a capacitor and a counter, the capacitor connected between the MOS transistor in parallel and the comparator, the counter for receiving the output signal of the comparator, the detecting transistor is reset and the counter is enabled simultaneously to determine a count value of the time for the capacitor to discharge and the comparator to output the signal. The comparator may be a Schmitt trigger. In another embodiment the controller receives the output signal of the comparator and adjusts a voltage/frequency supply to the MOS transistor.

Another aspect of the invention provides a system that comprises an array of NMOS and PMOS transistors in a CMOS array, the MOS transistor within the array, a voltage supply and frequency control adjustable and responsive to the detection of an current exceeding a threshold.

Another aspect of the invention provides a method for detecting current leakage in a MOS transistor in a CMOS environment, the method comprises providing a MOS transistor in a CMOS environment; detecting, with a current leakage detector electrically connected to the MOS transistor, a current between a drain and a source of the MOS transistor; producing an feedback signal, from a controller electrically connected to the current leakage detector, in response to detecting the current exceeding a predetermined value detected between the drain and the source of the MOS transistor; and adjusting frequency or voltage supply of the CMOS environment to prevent damage to the CMOS environment.

In embodiments, the current leakage detector may comprise a load control electrically connected to the MOS transistor, and comparator electrically connected to the MOS transistor and the load control. The load control may be a variable resistor. In another embodiment the load control may be a detecting transistor arranged in a compliment manner with the MOS transistor, and having a gate less susceptible to current leakage than the MOS transistor. The load control may further comprise a capacitor and a counter, the capacitor connected between the MOS transistor, in parallel and the comparator, the counter for receiving the output signal of the comparator, the detecting transistor is reset and the counter is enabled simultaneously to determine a count value of the time for the capacitor to discharge and the comparator to output the signal.

An embodiment of the method may further comprise receiving the output signal of the comparator at the controller, and adjusting via the controller a voltage/frequency supply to the MOS transistor.

In any of the embodiments, control over voltage or frequency may be facilitated by a digital control circuit. In the former case, the circuit may control an on-chip or off-chip power management circuit or power supply, such as a voltage regulator. In the latter case, the control circuit may set the output frequency of a clock source such as a phase-locked loop, or the derivative clocks sourced from the phase-locked loop.

DESCRIPTION OF THE DRAWINGS

An apparatus and method for incorporating the present invention will now be described, by way of example only, with reference to the accompanying drawings, in which.

DETAILED DESCRIPTION

Figure 1:
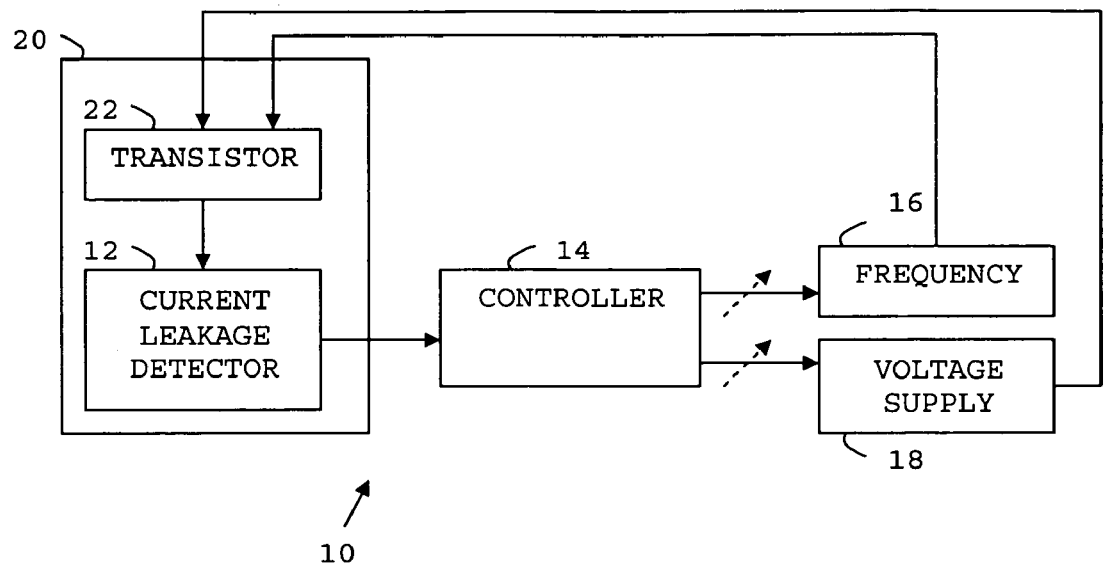
FIG. 1 shows an apparatus to detect transistor current leakage and monitor frequency and supply voltage within a CMOS environment in accordance with an embodiment of the invention.

Referring to FIG. 1, a system 10 is shown to detect current leakage of a device 22, such as a transistor, within a CMOS environment 20 in accordance with an embodiment of the invention. The system 10 detects excess current leakage with current leakage detector 12, and monitors and controls frequency 16 or supply voltage 18 with controller 14. The controller 14 receives signals from the current leakage detector 12 and controls the frequency or supply voltage accordingly in response to any excess current leakage detected by the current leakage detector 12. Although the arrow from detector 12 to controller 14 is shown as unidirectional, the controller may be arranged to disable the device (12).

Figures 2A, 2B:
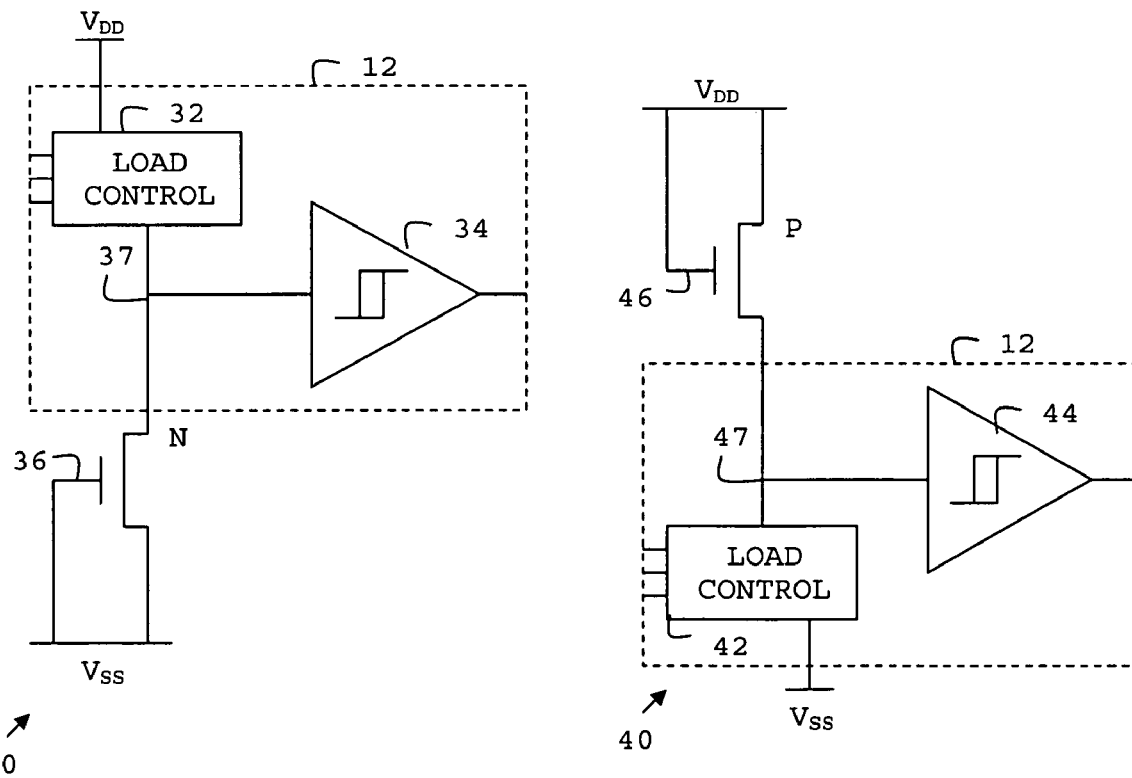
FIG. 2A-B show detection circuits of an embodiment of the invention.

FIG. 2A-B show circuit diagrams of a current leakage detector 12 in two different arrangements 30,40. One arrangement is shown in FIG. 2A for negative-channel MOS (NMOS), and another arrangement is shown in FIG. 2B for positive-channel MOS (PMOS) applications, respectively. In FIG. 2A the NMOS application is shown with negative-channel field effect transistor (NFET) 36 with drain and gate connected to ground ($V_{SS}$), and source connected via load control 32 and comparator Schmitt trigger 34. Voltage node 37 is the node formed by the connections between the source of transistor 36, load control 32 and comparator 34. Similarly, in FIG. 2B the PMOS application is shown with positive-channel field effect transistor (PFET) 46 with source and gate connected to power supply ($V_{DD}$), and drain connected via load control 42 and a comparator such as Schmitt trigger 44 forming voltage node 47. Schmitt triggers are well known in the industry, however, essentially a Schmitt trigger switches the polarity of the output in response to a change in input reaches a threshold. The output of the Schmitt trigger remains constant and does not switch polarity again until the input passes another threshold. In this embodiment a Schmitt trigger is used, however, any type of comparator that reliably measures analogue values may be used. Additionally, the threshold for switching the comparator may be any predetermined value, for example, $\frac{1}{2}V_{DD}$ or $\frac{1}{2}V_{SS}$ respectively. The load control 32,42 arrangement in this embodiment acts as a variable resistor, and the Schmitt trigger 34,44 has an output of the detector which indicates when an excessive current leakage is experienced above a predetermined amount within the NFET 36 or PFET 46, respectively. The arrangement replicates the transistor in an off mode configuration, and replicates expected current leakage. In other words, the load control 32,42 acts to model resistance leakage experienced in the associated respective FET 36,46 during active mode.

Figure 3A:
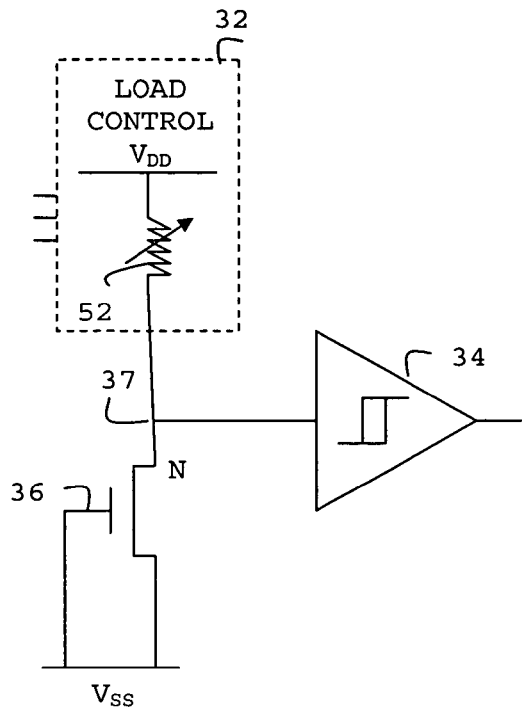
FIG. 3A-B show a current leakage detection circuit in accordance with an embodiment of the invention.
Figure 3B:
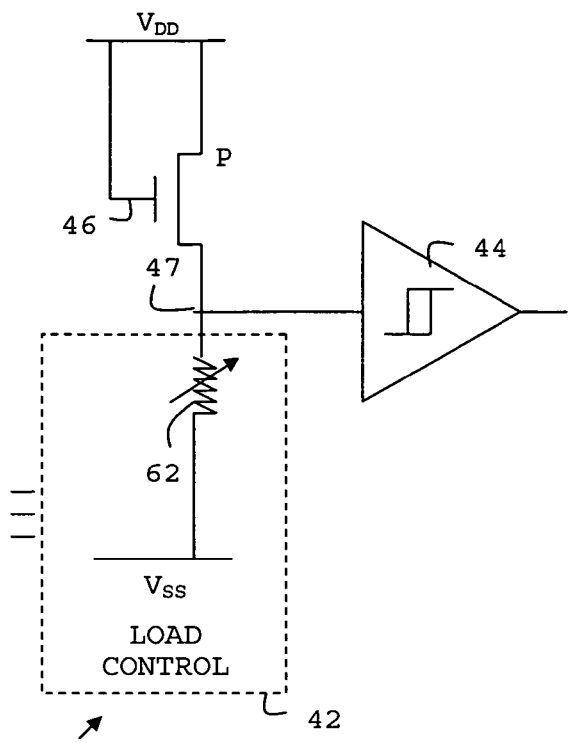

The load control 32,42 may be several different forms. In one embodiment 50,60, shown in FIGS. 3A and 3B, the load control 32,42 may comprise detecting devices such as a variable resistor 52,62, or other high ohmic value device. The detecting device is to detect current leakage in the monitored transistor 36,46. Although a variable resistor 52, 62 is shown, any other high ohmic value device that may be made a variable resistor by switching potentiometer, such as a weak transistor device, may be implemented. The detecting device selected is less susceptible to current leakage than the monitored transistor 36,46. For example if the detecting device of the load control 32,42 is a weak transistor, the transistor has a thicker polysilicon gate oxide, for example 35 Å to 100 Å, to ensure tolerance to gate breakdown appropriate for the specific application. The detecting device 52 of the load control 32 associated with the monitored NFET 36 of FIG. 2A may be a PMOS transistor that pulls the monitored NFET 36 to $V_{SS}$ or ground, and the resulting resistance is low. In this configuration, as the resulting impendence of the monitored transistor 36 is lower than the load control 32 the excess drain-source ($I_D$) current of the monitored transistor pulls the monitored voltage node 37 to low which is indicative of excess current in the monitored transistor at the load control setting sufficient to switch the output of the Schmidt trigger 34 detected and received at the Schmitt trigger 34. The output of the Schmitt trigger is received at the controller 14,56 for processing. Similarly, the load control 42 arrangement for the PFET device 60 of FIG. 3B is the compliment of the load control 32 arrangement for the NFET device 50 of FIG. 3A.

Figure 4:
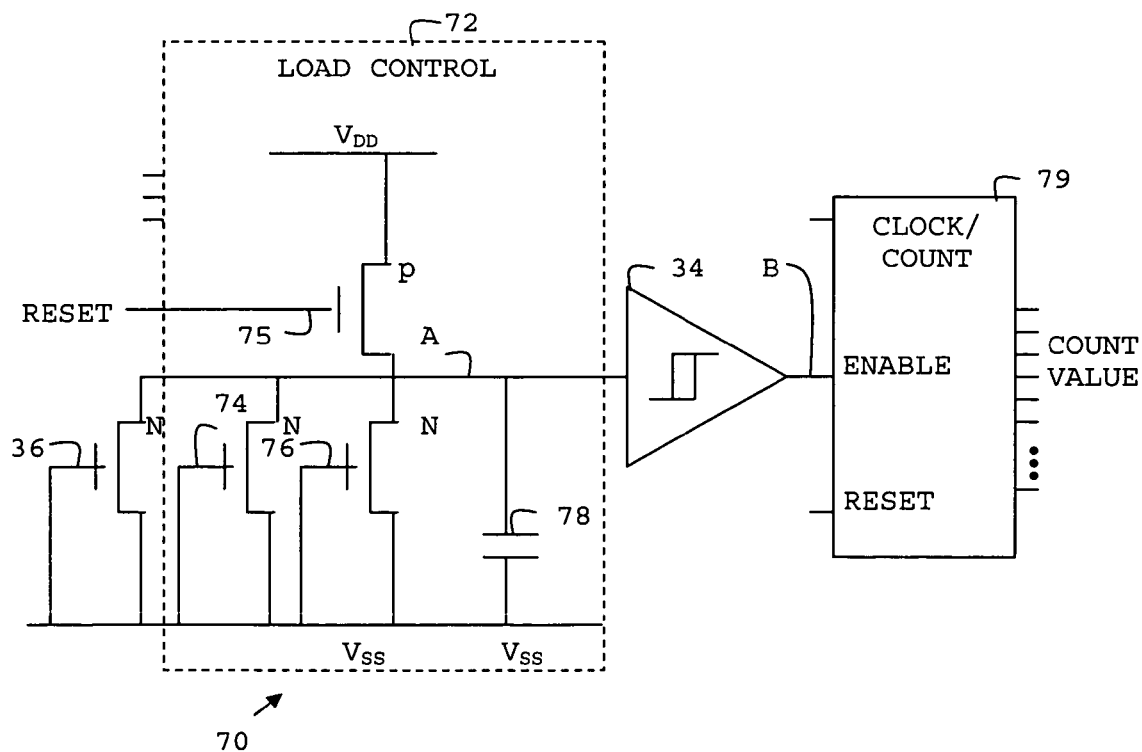
FIG. 4 shows a dynamic current leakage detection circuit in accordance with an embodiment of the invention.

These embodiments are static in the sense that two impedances are competing, i.e. the monitored transistors 36,46 and the detecting device 52,62 of the load control 32,42. In another embodiment 70, as shown in FIG. 4, the load control 32,42 may be dynamic in nature. For example, determining current leakage may be time-based in a charge/discharge circuit 72, Schmitt trigger 34, and counter 79. The load control circuit 72 of this embodiment may comprise a reset transistor 75 having source to $V_{DD}$, gate to reset, and drain linked to sources of two transistors 74,76 and the monitored transistor 36. The drain of the reset transistor is also connected to a capacitor 78, and Schmitt trigger 34. Another approach is to measure frequency, instead of clock 79.

Figure 5:
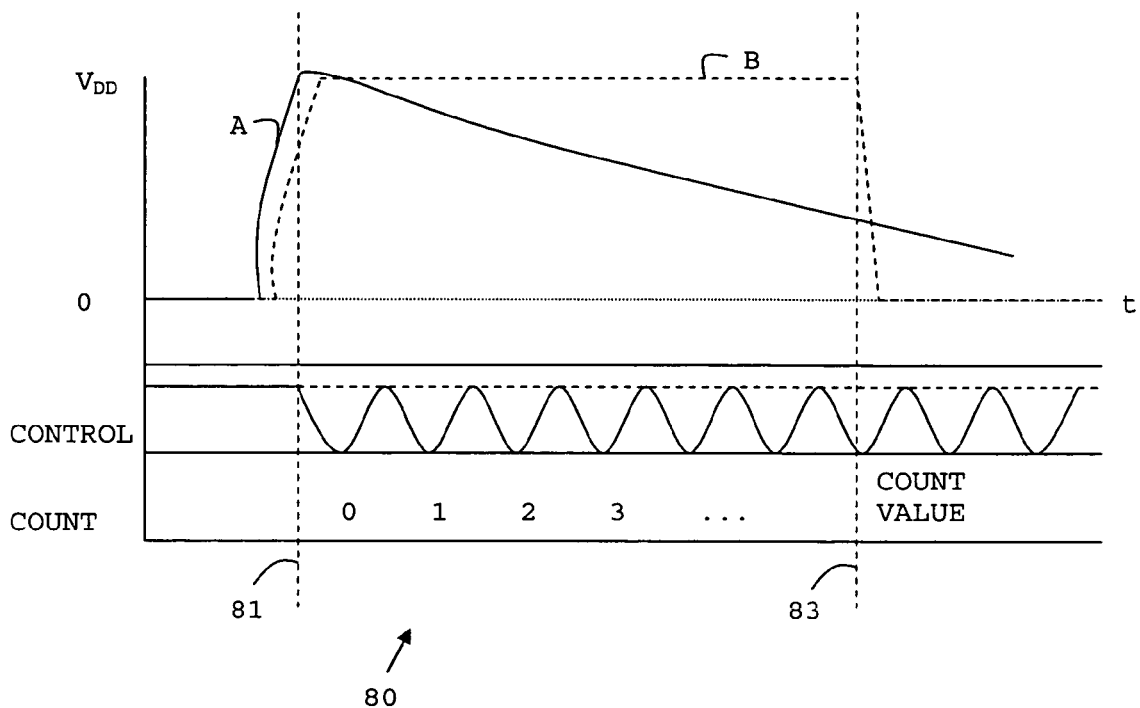
FIG. 5 shows a graph of the response over time of the current leakage detection circuit of FIG. 4 in accordance with an embodiment of the invention.

With reference to FIG. 5, a graph of the response over time of the current leakage detection circuit of FIG. 4 in the NMOS configuration 30 of FIG. 2A is shown. When the load control 32 is pulled hard high, represented by dashed line 81, the NMOS node with the reset PFET arrangement as shown in FIG. 4. However, time is measured of the capacitance discharge of a capacitor 78 to determine any existence of excess current leakage. For example, time is measured from the moment the PMOS detecting transistor is turned off hard as indicated by dashed line 81, and the counter is enabled, until node A passes through a predetermined voltage level of capacitance discharge, signalled as a voltage change on node B at a time indicated by dashed line 83. The predetermined voltage may be for example $V_{DD}/2$, or the like. This period of time is representative of the time taken for capacitance to discharge in the detecting PMOS transistor of the load control 32, which has a direct relationship with excess leakage current of the monitored transistor 36. The solid curve A is $V_{DD}$ as seen at point A of FIG. 4, and the dashed curve B is $V_{DD}$ as seen at point B at the output of the Schmitt trigger 34 of FIG. 4. The detecting transistor of the load control 42 may be turned on hard or off hard by a reset under the control of controller 14,79. The resulting time measured, represented by count value count by clock/counter in controller 79, to reach the predetermined point is then received by processor 56. The time measured is compared with a threshold amount excess in the processor 56. If the time measured is equal to or exceeds the threshold amount, excess current leakage exists in the monitored transistor 36. If the time measured does not exceed the threshold amount, then there is no detrimental current leakage. If there is an excess current leakage detected, the processor computes the amount of current leakage from the time measured, and then adjusts frequency 58 and voltage supply 60 accordingly. If the current leakage detected is severe enough to possibly damage the monitored transistor 36,46, or other devices in the system, the processor may instruct the IC voltage supply regulator 60 or frequency control 58 to turn off the power supply or frequency sequence in an attempt to prevent any permanent damage.

Figure 6:
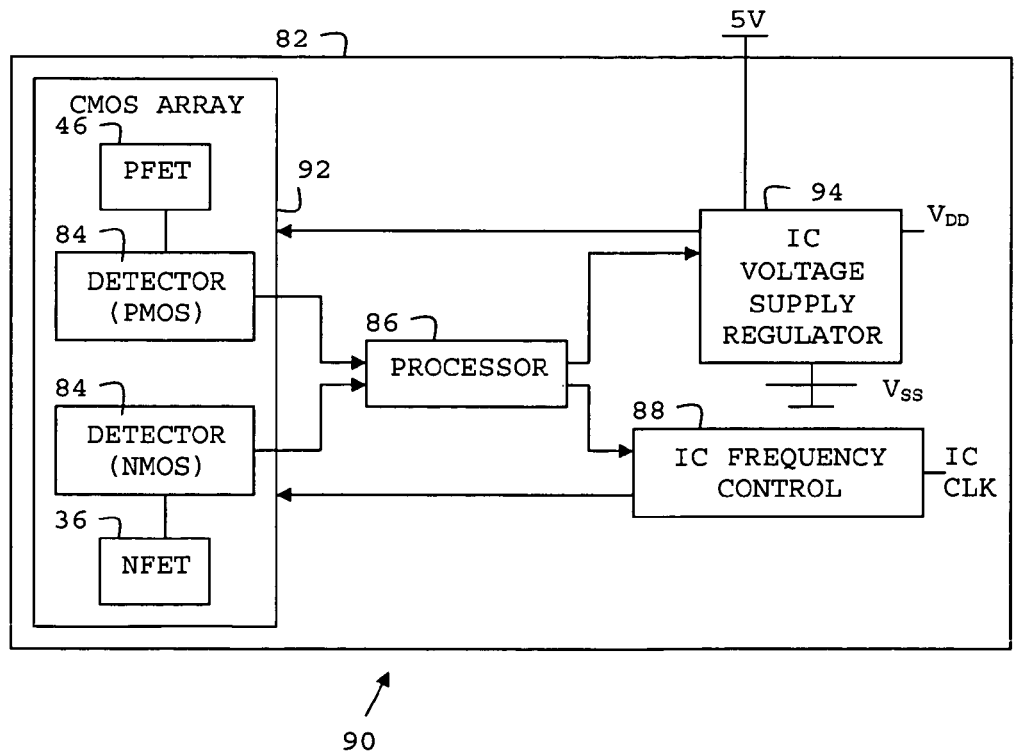
FIG. 6 shows a control loop block diagram implementing an apparatus in accordance with an embodiment of the invention within a CMOS system environment.
Figure 7:
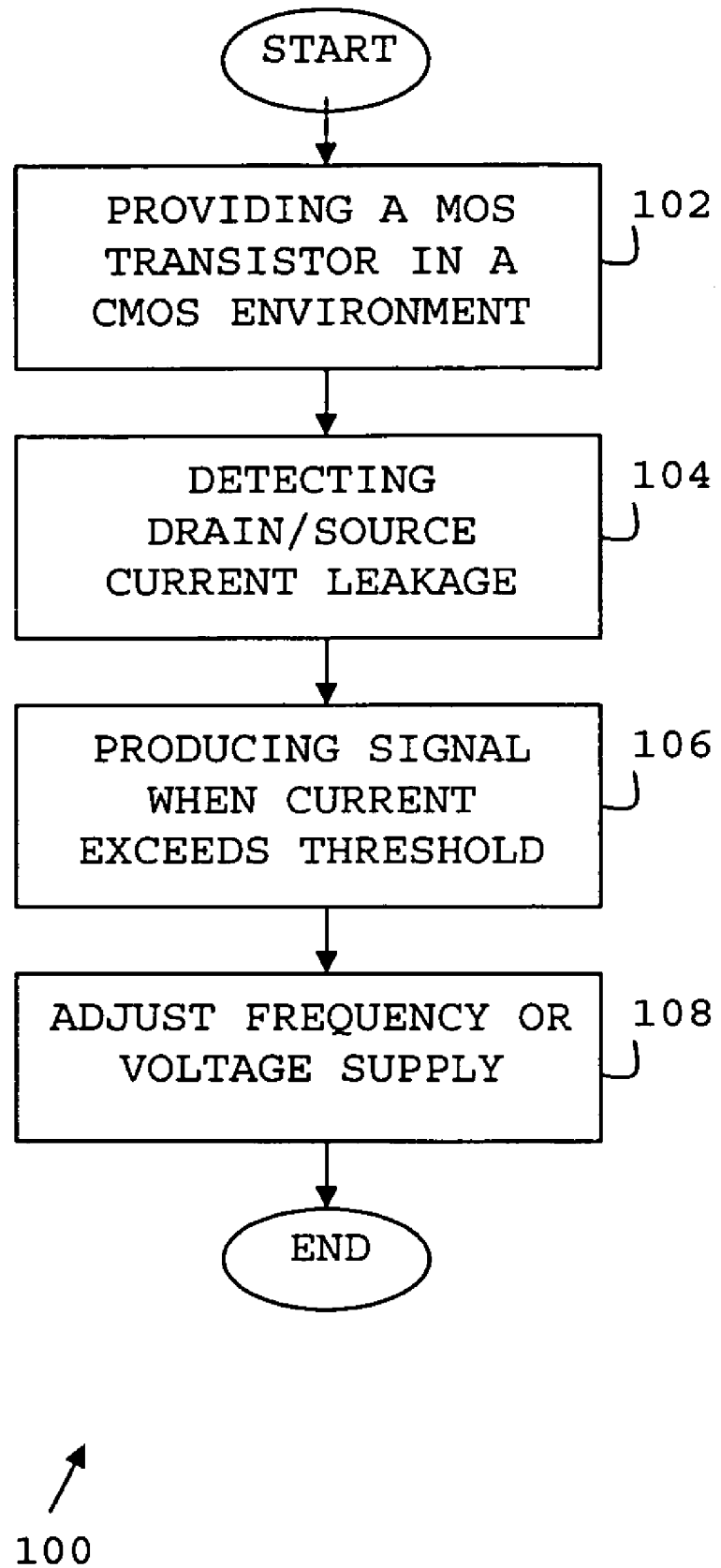
FIG. 7 shows a method in accordance with an embodiment of the invention.

In an embodiment, the NFET 36 and PFET 46 are components of the existing IC, as shown in FIG. 6. Also a method embodying the invention is shown in FIG. 7. Typically, an array of thousands of NMOS and compliment PMOS devices are arranged or provided in a CMOS environment 102. In this embodiment the NMOS and PMOS detectors 84 are formed within the existing array. The current leakage detector 12 is fabricated into the array design.

Although only one detector for each NMOS and PMOS is shown, it will be appreciated that any number of detectors may be used in any combination or area of the CMOS environment. For example, multiple detectors may be configured in several regions, such as at the corners, edges, center or the like of the CMOS environment to detect current leakage in the corresponding regions. With this arrangement the resulting temperature gradient across the CMOS environment may be monitored.

The outputs of the detectors 84 are received by controller 86. The controller 86 processes the signal 106 from the detectors 84 for any detection of excess current leakage. Upon detection 104 of an excess current leakage, the controller 86 adjusts 108 the IC voltage supply regulator 94 or the IC frequency 88. The IC voltage supply regulator 94 may adjust $V_{DD}$ to limit the current leakage experienced in the monitored transistor. Likewise, the IC frequency control 88 may adjust the frequency to limit the current leakage experienced in the monitored transistor. In an embodiment, the IC frequency control is a phase-locked loop (PLL) control for sequencing the IC clock. The IC voltage supply regulator 60 or voltage supply 18 may reside internal, as shown, or external, not shown, to the CMOS IC environment 52. The controller 14,86 may be any processor or microprocessors, which are well known in the industry. Of course, an embodiment may be implemented with computer software, hardware, or a combination of hardware and software.

It will be understood that the system and method for detecting and controlling excess current leakage of a CMOS device as described above provides advantages, such as reducing the risk of permanent thermal or other damage to CMOS ICs. It will be appreciated that specific embodiments of the invention are discussed for illustrative purposes, and various modifications may be made without parting from the scope of the invention as defined by the appended claims.

What is claimed is:

1. An apparatus for detecting current leakage from a MOS transistor within a CMOS environment, the apparatus comprising:
   a current leakage detector for detecting current leakage between a drain and a source of the MOS transistor, the current leakage detector electrically connected to the MOS transistor; and
   a controller electrically connected to the current leakage detector for adjusting a clock frequency or supply voltage of the CMOS environment in response to the current leakage detector detecting current leakage exceeding a predetermined value detected between the drain and the source of the MOS transistor to limit the current leakage.

2. An apparatus as claimed in claim 1 wherein the current leakage detector comprises:
   a load control electrically connected to the MOS transistor for detecting the current leakage between the drain and the source of the MOS transistor; and
   a comparator electrically connected to the MOS transistor and the load control, the comparator for providing an output signal in response to the current exceeding the predetermined value detected between the drain and the source of the MOS transistor.

3. An apparatus as claimed in claim 2 wherein the load control is a variable resistor.

4. An apparatus as claimed in claim 2 wherein the load control is a transistor less susceptible to current leakage than the MOS transistor.

5. An apparatus as claimed in claim 4 further comprising a counter for receiving the output signal of the comparator, wherein the load control comprises a capacitor connected in parallel with the MOS transistor and between the MOS transistor and the comparator, and wherein the transistor is reset and the counter is enabled simultaneously to determine a count value of the time for the capacitor to discharge and the comparator to output the signal.

6. An apparatus as claimed in claim 4 wherein the transistor is a PFET.

7. An apparatus as claimed in claim 5 wherein the transistor is a PFET.

8. An apparatus as claimed in claim 1 wherein the MOS transistor is an NFET.

9. An apparatus as claimed in claim 3 wherein the MOS transistor is an NFET.

10. An apparatus as claimed in claim 4 wherein the MOS transistor is an NFET.

11. An apparatus as claimed in claim 5 wherein the MOS transistor is an NFET.

12. An apparatus as claimed in claim 4 wherein the transistor is an NFET.

13. An apparatus as claimed in claim 5 wherein the transistor is an NFET.

14. An apparatus as claimed in claim 5 wherein the MOS transistor is a PFET.

15. An apparatus as claimed in claim 1 wherein the MOS transistor is a PFET.

16. An apparatus of claim 2 wherein the comparator is a Schmitt trigger.

17. An apparatus as claimed in claim 2 wherein the controller receives the output signal of the comparator and adjusts a supply voltage/clock frequency supplied to the MOS transistor.

18. An apparatus as claimed in claim 1 wherein the controller controls the supply voltage/clock frequency with a digital control circuit.

19. An apparatus as claimed in claim 18 wherein the controller controls the supply voltage from a power supply.

20. An apparatus as claimed in claim 19 wherein the power supply is a voltage regulator.

21. An apparatus as claimed in claim 18 wherein the controller controls the clock frequency from a clock source.

22. An apparatus as claimed in claim 21 wherein the clock source is a phase-locked loop.

23. A system having an apparatus of claim 1, the system comprising an array of NMOS and PMOS transistors in a CMOS array, the MOS transistor within the array, a voltage supply and clock frequency control adjustable and responsive to the detection of a current exceeding a threshold.

24. A method for detecting current leakage in a MOS transistor in a CMOS environment, the method comprising:
providing a MOS transistor in a CMOS environment;
detecting, with a current leakage detector electrically connected to the MOS transistor, current leakage between a drain and a source of the MOS transistor;
producing an output signal, from a controller electrically connected to the current leakage detector, in response to the current leakage detector detecting current leakage exceeding a predetermined value detected between the drain and the source of the MOS transistor; and
adjusting a clock frequency or voltage supply of the CMOS environment to limit the current leakage.

25. A method as claimed in claim 24 wherein the current leakage detector comprises a load control electrically connected to the MOS transistor, and a comparator electrically connected to the MOS transistor and the load control.

26. A method as claimed in claim 25 wherein the load control is a variable resistor.

27. A method as claimed in claim 25 wherein the load control is a transistor less susceptible to current leakage than the MOS transistor.

28. A method as claimed in claim 25 further comprising a counter for receiving the output signal of the comparator, wherein the load control comprises a capacitor connected in parallel with the MOS transistor and between the MOS transistor and the comparator, and wherein the transistor is reset and the counter is enabled simultaneously to determine a count value of the time for the capacitor to discharge and the comparator to output the signal.

29. A method as claimed in claim 27 further comprising a counter for receiving the output signal of the comparator, wherein the load control further comprises a capacitor connected in parallel with the MOS transistor and between the MOS transistor and the comparator, and wherein the transistor is reset and the counter is enabled simultaneously to determine a count value of the time for the capacitor to discharge and the comparator to output the signal.

30. A method as claimed in 25 further comprising receiving the output signal of the comparator at the controller, and adjusting via the controller a supply voltage/clock frequency supply to the MOS transistor.

* * * * *